United States Patent
Kim et al.

(10) Patent No.: US 8,350,162 B2
(45) Date of Patent: Jan. 8, 2013

(54) CONNECTING STRUCTURE FOR CIRCUIT BOARD AND CONNECTING METHOD USING THE SAME

(75) Inventors: Hyun Tae Kim, Suwon-si (KR); Tae Sang Park, Seoul (KR); Young Jun Moon, Hwaseong-si (KR); Soon Min Hong, Seoul (KR); Hyo Young Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 257 days.

(21) Appl. No.: 12/659,556

(22) Filed: Mar. 12, 2010

(65) Prior Publication Data

US 2010/0243309 A1  Sep. 30, 2010

(30) Foreign Application Priority Data

Mar. 24, 2009  (KR) ........................ 10-2009-0024884

(51) Int. Cl.
*H05K 1/11* (2006.01)

(52) U.S. Cl. ....................................... 174/263; 174/261

(58) Field of Classification Search .......... 174/250–263; 361/681, 760, 789; 29/830, 879; 439/74, 439/65

See application file for complete search history.

(56) References Cited

U.S. PATENT DOCUMENTS

| 5,534,667 | A  | * | 7/1996 | Miyamoto et al. | 174/261 |
| 5,896,276 | A  | * | 4/1999 | Tamura et al. | 361/767 |
| 6,465,747 | B2 | * | 10/2002 | DiStefano et al. | 174/261 |
| 6,605,357 | B1 | * | 8/2003 | Miyake et al. | 428/420 |
| 6,921,860 | B2 | * | 7/2005 | Peterson et al. | 174/523 |
| 7,544,897 | B2 | * | 6/2009 | Kobayashi | 174/254 |
| 2008/0139011 | A1 | * | 6/2008 | Uka | 439/65 |

* cited by examiner

*Primary Examiner* — Yuriy Semenenko
(74) *Attorney, Agent, or Firm* — Harness, Dickey & Pierce, P.L.C.

(57) ABSTRACT

Disclosed is a connection structure for a circuit board using a solder bump to arrange circuit boards. The circuit board connection structure includes a solder bump prepared on one of two circuit boards and a perforated part formed at the other of the circuit boards to receive the solder bump. Facing both circuit boards towards each other and inserting the solder bump into the perforated part, the circuit boards are desirably arranged.

13 Claims, 9 Drawing Sheets

CONNECTING STRUCTURE FOR CIRCUIT BOARD AND CONNECTING METHOD USING THE SAME

CROSS-REFERENCE TO RELATED APPLICATION

This application claims priority under 35 U.S.C. §119 to Korean Patent Application No. 2009-0024884, filed on Mar. 24, 2009 with the Korean Intellectual Property Office (KIPO), the entire contents of which are herein incorporated by reference.

BACKGROUND

1. Field

Example embodiments relate to a connection structure for a circuit board using a solder bump to connect two circuit boards.

2. Description of the Related Art

A printed circuit board (PCB) may serve to connect a plurality of electronic devices in a certain framework and is widely employed in a number of electronic products including, for example, electrical home appliances, e.g., digital TVs and advanced telecommunication devices.

In certain electronic devices, for example, a mobile phone or a digital camera, a thin folding type flexible printed circuit (FPC) is used for fabrication of an internal wiring. With increased miniaturization as well as enlargement of a movable part in the mobile phone, such FPC is increasingly used. When connecting the FPC to a rigid substrate used as a main board, a connector or an anisotropic conductive film (ACF) may be used.

Connectors are well known and widely used to provide a connection between boards and, in particular, may have a merit of repetitive attachment/detachment of FPC. However, it is difficult to employ connectors with complicated shapes in automatic connections thereof and to reduce a size of the connector due to three-dimensional space occupied thereby.

An ACF is a thermosetting resin film containing conductive single particles. In adhering the ACF at a terminal part of one substrate and laminating a terminal of another substrate over the adhered ACF, the laminate is pressed so that a conductive terminal is inserted between two opposite electrode faces, thereby guaranteeing electrical through-connection between terminals via the inserted conductive terminal. The ACF connection may have merits in connection of narrow pitches. However, as the conductive particle connects with the terminals, it may exhibit higher resistance at connection parts as compared to soldering connection. Because the resin hardens over time, the resin is duly removed using a particular solvent. Accordingly, the ACF described above has problems of increased time and/or cost, as compared to repairing of soldered products.

BRIEF SUMMARY OF THE INVENTION

Example embodiments provide a connection structure for a circuit board fabricated using a solder bump to connect two circuit boards.

Example embodiments provide a connection structure for a circuit board, fabricated using a solder bump to arrange two circuit boards and maintain the arrangement.

In accordance with example embodiments, a connection structure for a circuit board may include a first circuit board having at least one first connection terminal, a second circuit board having at least one second connection terminal, and at least one solder bump on the at least one first connection terminal. In example embodiments, the at least one second connection terminal may include a connecting part receiving at least a part of the at least one solder bump.

In accordance with example embodiments, a connection structure of a circuit board may include a first circuit board having at least one first connection terminal, a second circuit board having at least one second connection terminal corresponding to the first connection terminal, and at least one connecting protrusion electrically connecting the at least one first connection terminal to the at least one second connection terminal. In example embodiments, the at least one connecting protrusion may be on the first circuit board and the second circuit board may have a perforated part coupled with the at least one connecting protrusion.

In accordance with example embodiments, a process for connection of circuit boards using a solder bump to connect a first circuit board and a second circuit board may include preparing the solder bump on one of the first circuit board and the second circuit board and inserting the solder bump into the other of the first circuit board and the second circuit board.

In accordance with example embodiments, a connection structure for a circuit board may include a first circuit board having at least one first connection terminal, a second circuit board having at least one second connection terminal, and a solder bump placed at the first connection terminal. In example embodiments, the second connection terminal may have a connecting part to receive at least a part of the solder bump.

In this regard, the second circuit board may include a perforated part to receive at least a part of the solder bump and the connecting part may be placed in the perforated part.

In example embodiments, the connecting part may be positioned to enclose an inner side of the perforated part or, otherwise, to enclose the periphery of the perforated part.

In example embodiments, the solder bump may be smaller than the perforated part.

In example embodiments, the solder bump may include a part smaller than the perforated part.

In example embodiments, the perforated part may be formed in a round shape while the connecting part may be formed in a ring shape.

In example embodiments, the first connection terminal may comprise a plurality of connection terminals aligned in zig-zag form. Likewise, the second connection terminal may comprise a plurality of connection terminals aligned in zig-zag form.

In example embodiments, the connection structure may further include a first solder mask to prevent or reduce the plural first connection terminals from being interconnected.

In example embodiments, the connection structure may further include a second solder mask to prevent or reduce the plural connection terminals from being interconnected.

In example embodiments, the first connection terminal may comprise a plurality of connection terminals aligned in a row. Likewise, the second connection terminal may comprise a plurality of connection terminals aligned in a row.

In example embodiments, the connecting part may be fixed to the solder bump so as to arrange positions of the first circuit board and the second circuit board.

In accordance with example embodiments, a connection structure for a circuit board may include a first circuit board having at least one first connection terminal, a second circuit board having at least one second connection terminal which corresponds to the first connection terminal, and at least one connecting protrusion to electrically connect the first connection terminal to the second connection terminal. In example embodiments, the connecting protrusion may be placed on the first circuit board and the second circuit board may have a perforated part to be coupled with the connecting protrusion.

In example embodiments, the second connection terminal may include a connecting part in the perforated part and the connecting part may be coupled with the connecting protrusion.

In example embodiments, the perforated part and the connecting part may receive at least a part of the connecting protrusion.

In accordance with example embodiments, a process for connection of circuit boards performed using a solder bump to connect a first circuit board and a second circuit board may include preparing the solder bump on one of the first circuit board and the second circuit board, and inserting the solder bump into the other of the first circuit board and the second circuit board.

In example embodiments, the above connection process may further include fusing the solder bump.

In example embodiments, the above connection process may further include supplying fused solder between the first circuit board and the second circuit board.

In example embodiments, the second circuit board may have a perforated part to receive the solder bump.

As disclosed above, the circuit board connection structure according to example embodiments may arrange two circuit boards without additional equipment in a process for connection of circuit boards.

According to the example process for connection of circuit boards, the circuit board is not pushed during sliding a soldering iron tip so as to prevent or retard the arrangement of two circuit boards from being distorted and to inhibit an increase in transfer resistance due to lack of solder between two electrodes.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein. In accordance with example embodiments:

DETAILED DESCRIPTION

Example embodiments will now be described more fully with reference to the accompanying drawings, in which example embodiments are shown. The invention may, however, be embodied in different forms and should not be construed as limited to the embodiments set forth herein. Rather, example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Reference will now be made in detail to example embodiments of which are illustrated in the accompanying drawings, wherein like reference numerals refer to like elements throughout.

A connection structure for a circuit board according to example embodiments will be described in detail with reference to the accompanying drawings.

Figure 1:
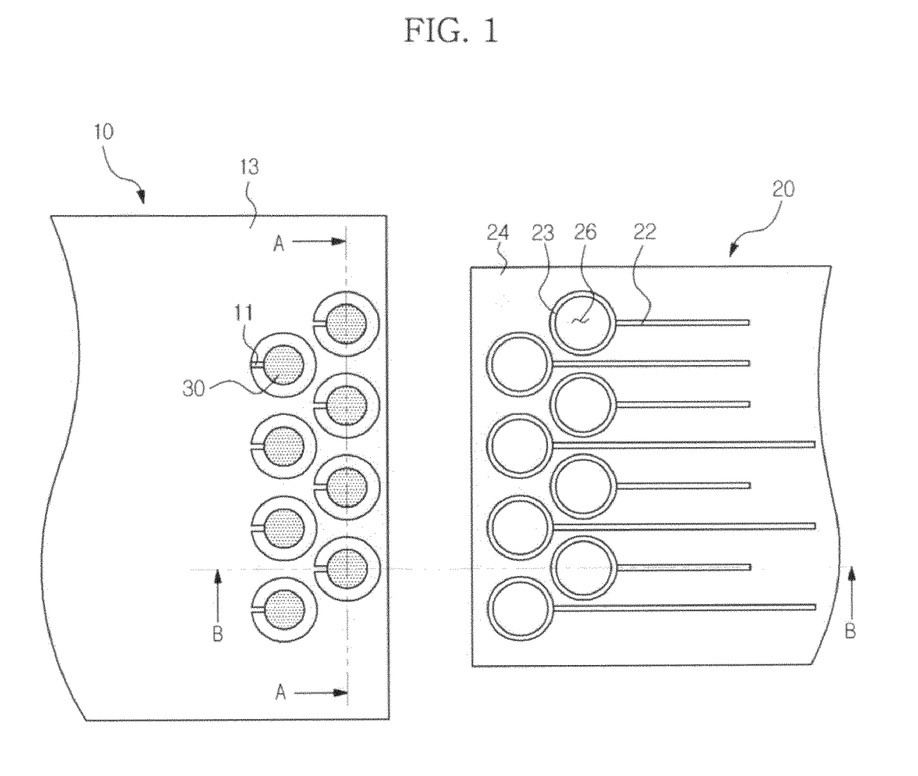
FIG. 1 is a plan view illustrating a first circuit board and a second circuit board in a circuit board connection structure according to example embodiments, before connection thereof.
Figure 2:
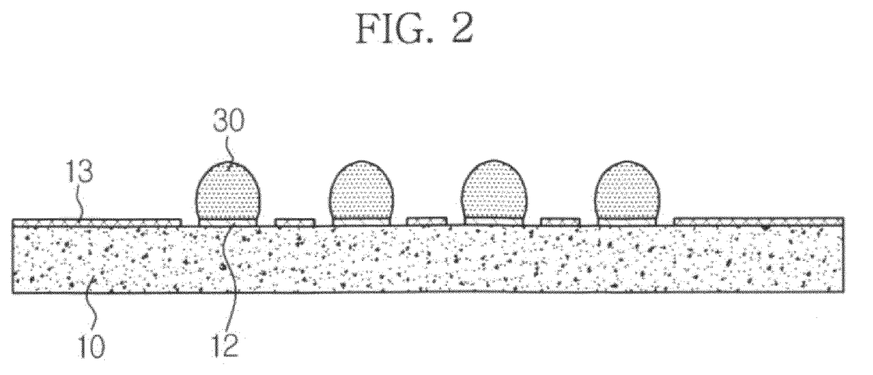
FIG. 2 is a cross-sectional view taken along the line A-A shown in FIG. 1.
Figure 3:
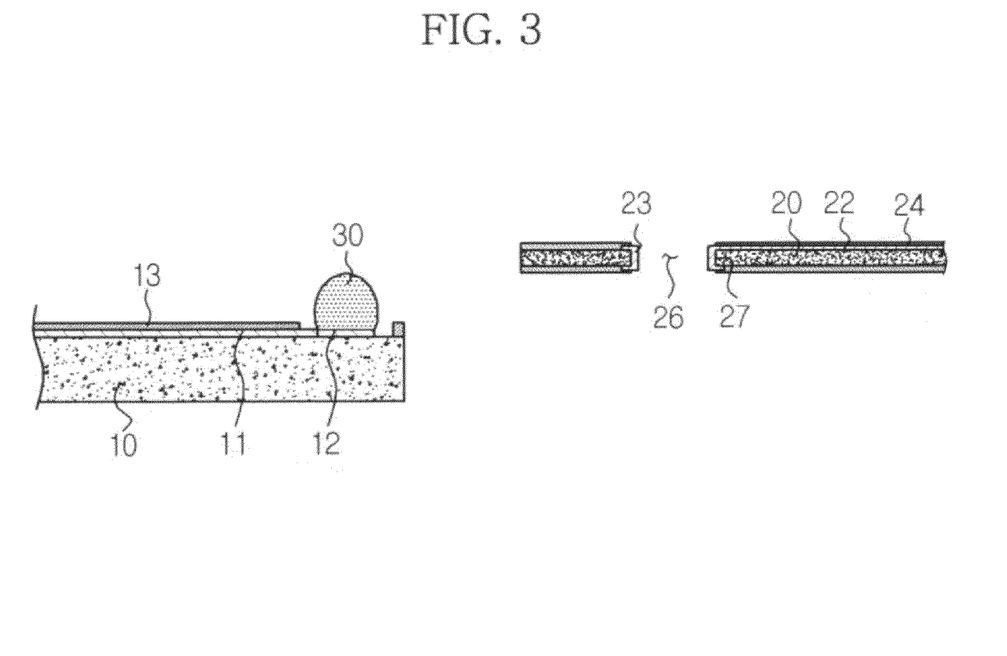
FIG. 3 is a cross-sectional view taken along the line B-B shown in FIG. 1.

FIG. 1 is a plan view illustrating portions of a first circuit board and a second circuit board in a circuit board connection structure according to example embodiments, before a connection thereof. FIG. 2 is a cross-sectional view taken along the line A-A shown in FIG. 1. FIG. 3 is a cross-sectional view taken along the line B-B shown in FIG. 1.

As shown in FIGS. 1 to 3, a circuit board connection structure may be employed for connection of circuit boards with a variety of types and shapes. Such a structure may include a first circuit board 10 having at least one first connection terminal 11, a second circuit board 20 having at least one second connection terminal 22, and a solder bump 30 in order to connect the first connection terminal 11 to the second connection terminal 22. Each of the first circuit board 10 and the second circuit board 20 may comprise a rigid circuit board or a flexible circuit board. Because the solder bump 30 connects the first connection terminal 11 to the second connection terminal 22, the solder bump 30 may allow current to pass from the first connection terminal 11 to the second connection terminal 22 and from the second connection terminal 22 to the first connection terminal 11.

The first connection terminal 11 may be integrated into the first circuit board 10. The first connection terminal 11 may have a first connecting part 12 in a flat form with the solder bump 30 on the flat first connecting part 12. The solder bump 30 may be fixed to the first connecting part 12 of the first connection terminal 11 and may be protruded to a certain height. In example embodiments, the height may or may not be predetermined. FIGS. 1 to 3 illustrate the solder bump 30 in an approximately spherical form, however, the shape of the solder bump 30 is not particularly limited thereto and may be embodied in a variety of forms.

In FIG. 1, a plurality of first connection terminals 11 may be used. In order to perform general functions of the first circuit board 10, it may be necessary to prevent the plurality of first connection terminals 11 from being interconnected during connection of the circuit board. Therefore, the first connection terminals 11 may be spaced from one another at a certain interval. When a large number of first connection terminals 11 are used, that is, when a pitch spacing between adjacent first connection terminals 11 is relatively small, aligning the first connection terminals 11 in a zig-zag form as shown in FIG. 1 may prevent them from being interconnected or may reduce an interconnection that may form therein. Also, a first solder mask 13 may be integrated into the first circuit board 10 in order to enclose the plurality of first connection terminals 11 so that interconnection of the first connection terminals 11 optionally caused by impurities may be prevented or reduced.

In example embodiments, it may be required that the first connecting part 12 of each of the first connection terminals 11 be connected with a second connecting part 23 of each of the second connection terminals 22 and, therefore, the first solder mask 13 may not cover the first connecting part 12 of the first connection terminal 11 and surroundings thereof. The first connecting parts 12 of the plurality first connection terminals 11 may be spaced from one another and the first solder mask 13 may be formed between and around the first connecting parts 12 so that interconnection of the first connection parts 12 of the first connection terminals 11 by fused solder during connection of the circuit board may be prevented or reduced.

The second connection terminal 22 may be formed or placed on the second circuit board 20. The second connection terminal 22 may have the second connecting part 23 in a ring form, into which the solder bump 30 may be inserted. In other words, the second circuit board 20 may include a perforated part 26 opening in a vertical direction and the second connecting part 23 of the second connection terminal 22 may be in the perforated part 26. The second connecting part 23 of the second connection terminal 22 may be formed on an inner side 27 of the perforated part 26. Such second connecting part 23 of the second connection terminal 22 may be constructed so that the solder bump 30 may be inserted into the perforated part 26, thereby being easily connected with the solder bump 30. FIGS. 1 to 3 illustrate a ring type second connecting part 23 of the second connection terminal 22, however, a shape of the second connecting part is not particularly limited thereto and may be embodied in a variety of forms.

A plurality of second connection terminals 22 may be used. In order to perform general functions of the second circuit board 20, it may be necessary to prevent the plurality of second connection terminals 22 from being optionally interconnected during connection of the circuit board. Therefore, the second connection terminals 22 may be spaced from one another at a certain interval. In example embodiments, the certain interval may or may not be predetermined. When a large number of second connection terminals 22 are used, that is, when a pitch spacing between adjacent second connection terminals 22 is relatively small, aligning the second connection terminals 22 in a zig-zag form as shown in FIG. 1 may prevent them from being interconnected or reduce an interconnection that may form between the second connection terminals 22. Also, a second solder mask 24 may be formed on the second circuit board 20 in order to enclose the plurality of second connection terminals 22 so that interconnection of the second connection terminals 22 optionally caused by impurities may be prevented or retarded. In example embodiments, it may be required that the second connecting part 23 of each of the second connection terminals 22 be connected with a first connecting part 12 of each of the first connection terminals 11 and, therefore, the second solder mask 24 may not cover the second connecting part 23 of the second connection terminal 22 and surroundings thereof.

Figure 4:
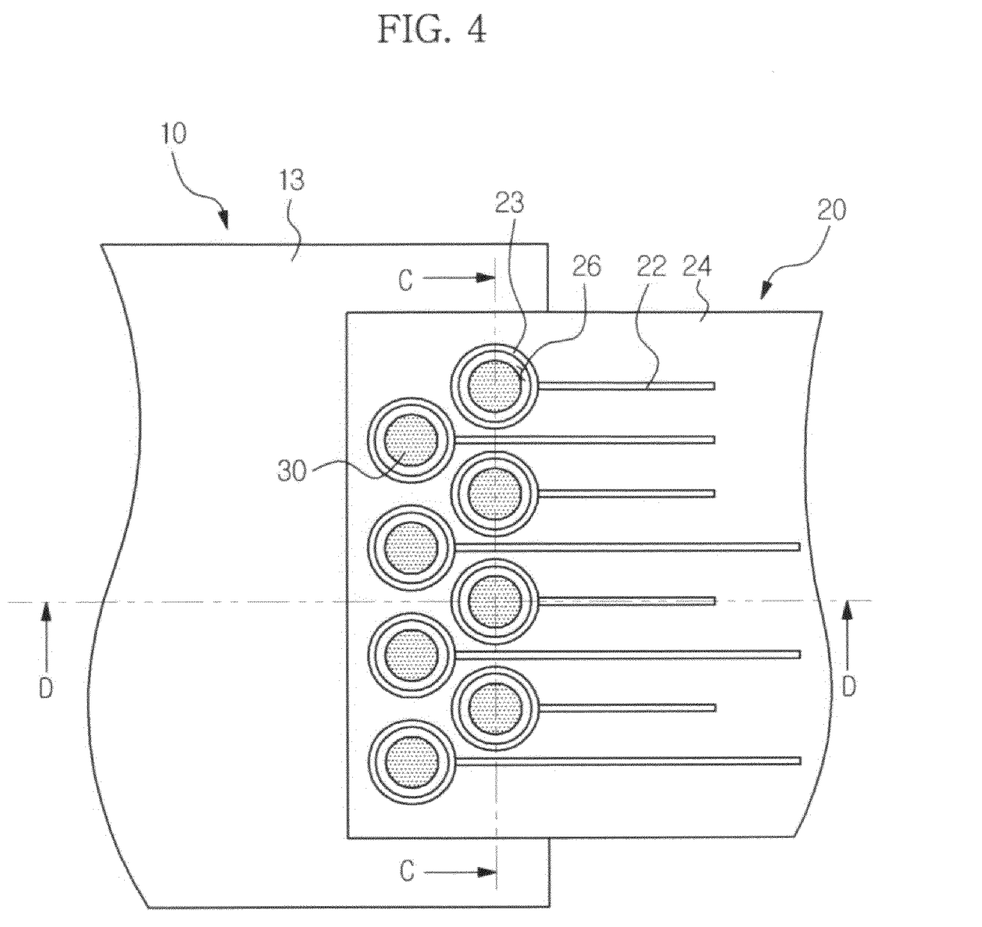
FIG. 4 is a plan view illustrating the first circuit board and the second circuit board connected to each other using the circuit board connection structure according to example embodiments.
Figure 5:
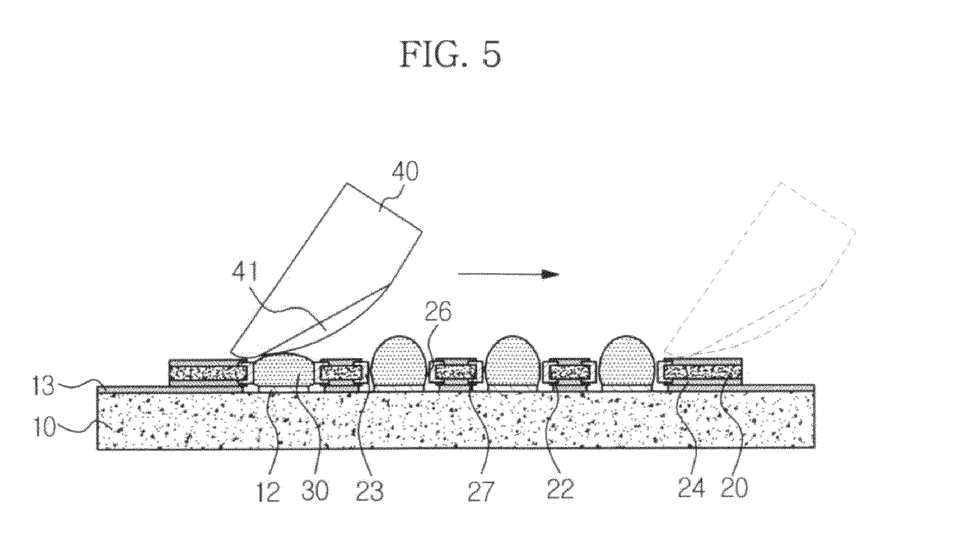
FIG. 5 is a cross-sectional view taken along the line C-C shown in FIG. 4.
Figure 6:
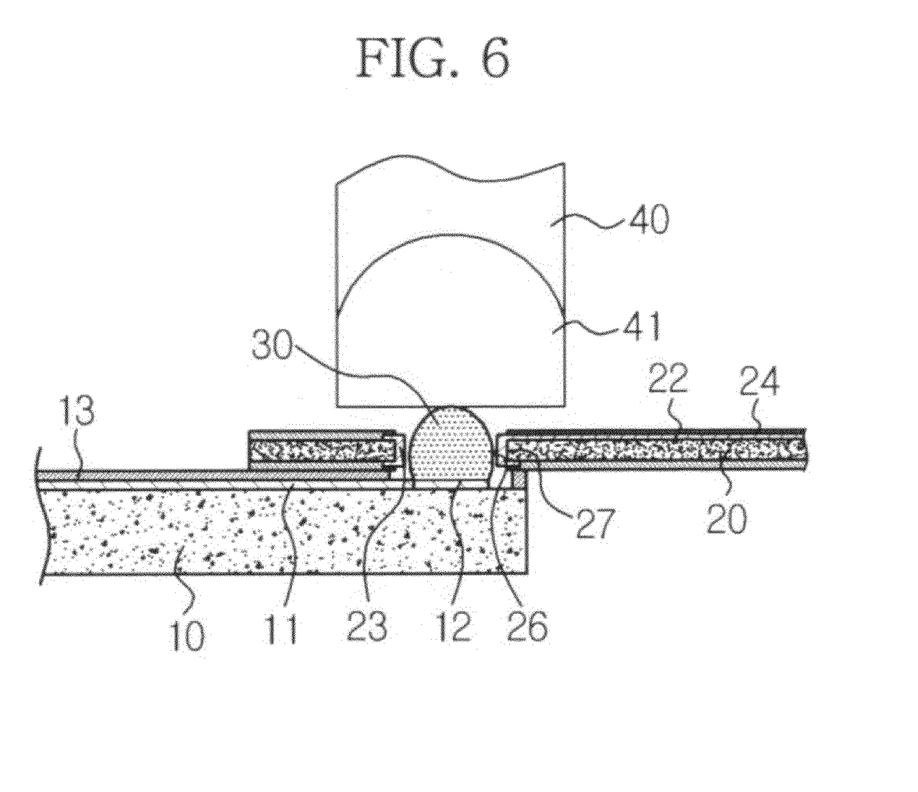
FIG. 6 is a cross-sectional view taken along the line D-D shown in FIG. 4.

FIG. 4 is a plan view illustrating the first circuit board 10 and the second circuit board 20 connected to each other in the circuit board connection structure according to example embodiments. FIG. 5 is a cross-sectional view taken along line C-C as shown in FIG. 4. FIG. 6 is a cross-sectional view taken along line D-D as shown in FIG. 4.

As shown in FIGS. 4 to 6, the connection structure for a circuit board according to example embodiments may be employed to arrange the first circuit board 10 and the second circuit board 20 using the solder bump 30. In example embodiments, the first circuit board 10 may be placed under a bottom surface of the second circuit board 20. In example embodiments, the solder bump 30 formed on the first circuit board 10 is inserted into the perforated part 26 of the second circuit board 20. If a plurality of solder bumps 30 are inserted into a plurality of perforated parts 26, the plurality of first connection terminals 11 may correspond to a plurality of second connection terminals 22, respectively, so that arrangement of the first circuit board 10 and the second circuit board 22 may be easily embodied.

In example embodiments, the second circuit board 20 may be fixed to the solder bump 30. Accordingly, the solder bump 30 may restrict movement of the second circuit board 20 relative to the first circuit board 10. Therefore, the solder bump 30 may continuously maintain an arrangement of the first circuit board 10 and the second circuit board 20. As shown in FIG. 5, the first circuit board 10 may be connected with the second circuit board 20 by sliding soldering. Therefore, the second circuit board 20 may be fixed to the solder bump 30 and movement thereof may be restricted even if a soldering iron tip 40 slides over or contacts the second circuit board 20. Accordingly, an arrangement of the first circuit board 10 and the second circuit board 20 may be maintained. In this regard, the soldering iron tip 40 may stably supply fused solder 41 between the first connection terminal 11 and the second connection terminal 22, thereby solving a problem of increased transfer resistance caused by lack of solder between both connection terminals 11 and 22.

In example embodiments it is not necessary to entirely insert the solder bump into the perforated part 26. In example embodiments, the solder bump 30 may not be entirely inserted into the perforated part 26, instead only a portion of the solder bump 30 may be inserted into the perforated part 26. By inserting only a portion of the solder bump 30 into the perforated part 26 arrangement of the first circuit board 10 and the second circuit board 20 may be easily performed. That is, if the solder bump 30 has a part inserted into the perforated part 26, the first circuit board 10 and the second circuit board 20 may be easily arranged even though the formed solder bump 30 is larger than the perforated part 26.

Hereinafter, a process for connecting circuit boards using the connection structure for a circuit board according to example embodiments will be described in greater detail.

Referring to FIGS. 1 to 6, the solder bump 30 is placed on the first circuit board 10. More particularly, the solder bump 30 is positioned to fix the same to the first connecting part 12 of the first connection terminal 11.

According to example embodiments, the perforated part 26 is formed on the second circuit board 20. The perforated part 26 may be larger than the solder bump 30 in order to receive the solder bump 30. However, even if the formed perforated part 26 is smaller than the solder bump 30, example embodiments may be favorably employed when the perforated part 26 is formed to receive at least a part of the solder bump 30.

The first circuit board 10 is connected with the second circuit board 20 using the solder bump 30. The solder bump 30 formed on the first circuit board 10 is inserted into the perforated part 26 formed on the second circuit board 20. While maintaining arrangement of the first circuit board 10 and the second circuit board 20, the solder iron tip 40 slides over the second circuit board 20 and supplies fused solder 41 between the first connection terminal 11 and the second connection terminal 22. As a result, the solder bump 30 is fused and connects the first connection terminal 11 and the second connection terminal 22.

In example embodiments, the solder iron tip 40 may heat and melt the solder bump 30, thus, the melted solder from the solder bump 30 may spread and flow to connect the first connecting part 12 to the first connection terminal 11. Additionally, fused solder 41 may be supplied to the connection part, that is, in the perforated part 26 occupied by the solder bump 30, to connect the solder bump 30 to the second connection terminal 22. As another alternative, the iron tip 40 may be configured to melt the solder bump 30 and provide solder in the perforated part 26 to connect the first connecting part 12 to the second connection terminal 11.

Figure 7:
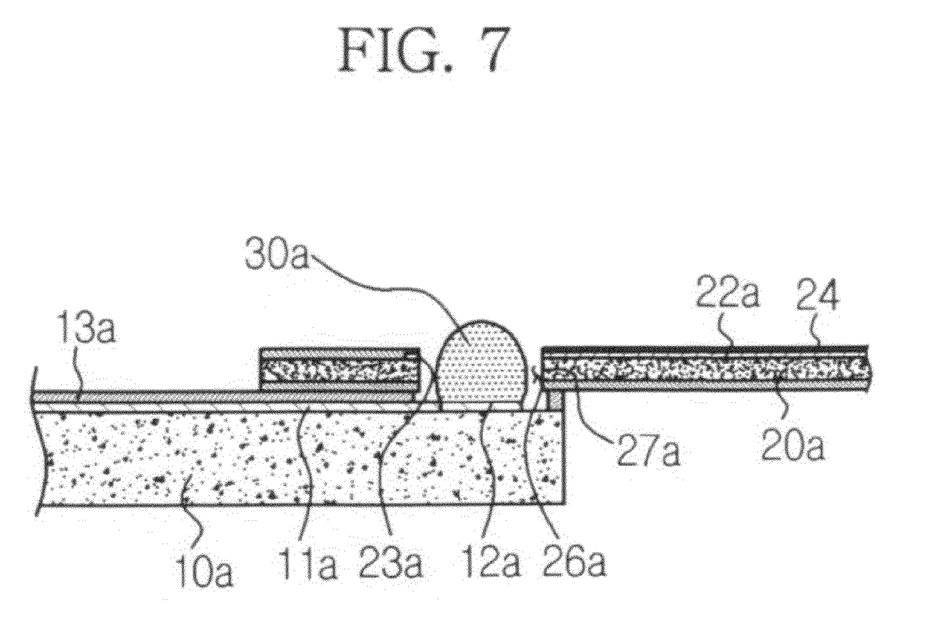
FIG. 7 shows a second connection terminal according to example embodiments.

FIG. 7 illustrates a second connection terminal according to example embodiments.

As shown in FIG. 7, a second connection terminal 22a may be integrated into a second circuit board 20a. A second connecting part 23a of the second connection terminal 22a may be placed in the perforated part 26a, which may be the same as illustrated in FIG. 2 except that a second connecting part 23a of the second connection terminal 22a may be not positioned at an inner side 27a of the perforated part 26a. That is, the second connecting part 23a of the second connection terminal 22a may be formed along an external periphery of the perforated part 26a at a top side of the perforated part 26a. In example embodiments, a process for fabrication of the second circuit board 20a may be relatively easy and simple.

The solder bump 30a may be inserted into the perforated part 26a to supply fused solder to the first and second connection terminals 11a and 22a while maintaining arrangement of the first circuit board 10a and the second circuit board 20a, so that the first connection terminal 11a may be connected with the second connection terminal 22a via the solder bump 30a. Like example embodiments according to FIG. 1, the first connection terminal 11a may include a first connecting part 12a and a first solder mask 13a may be formed on a surface of the first circuit board 10a.

Figure 8:
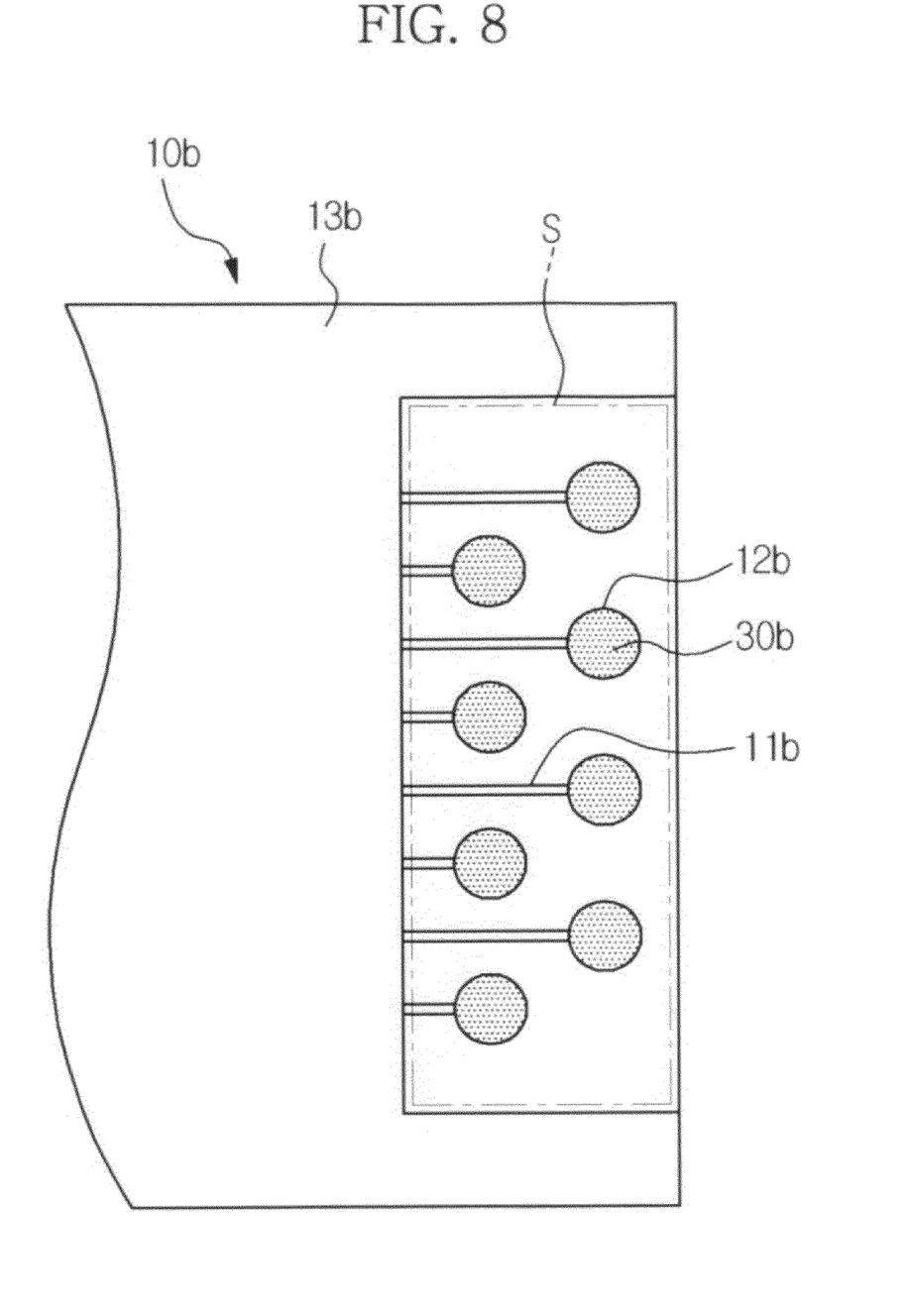
FIG. 8 shows a first circuit board according to example embodiments.

FIG. 8 shows a first circuit board according to example embodiments.

As shown in FIG. 8, a solder mask 13b may be placed on a first circuit board 10b to enclose a first connection terminal 11b. However, the solder mask 13b may not be present in a region S including a first connecting part 12b of the first connection terminal 11b and surroundings thereof. Referring to FIG. 1, the first solder mask 13 may be placed between plural first connecting parts 12 of first connection terminals 11. However, in FIG. 8, if an amount of supplied fused solder is accurately controlled during fabrication of a circuit board, interconnection of the plural first connection parts 12b of the first connection terminals 11b may be prevented or reduced even though the solder mask 13b is not present in the region S including the first connecting part 12b of the first connection terminal 11b and surroundings thereof as shown in FIG. 8. In FIG. 8, 30b represents a solder bump accurately formed in the region S.

Figure 9:
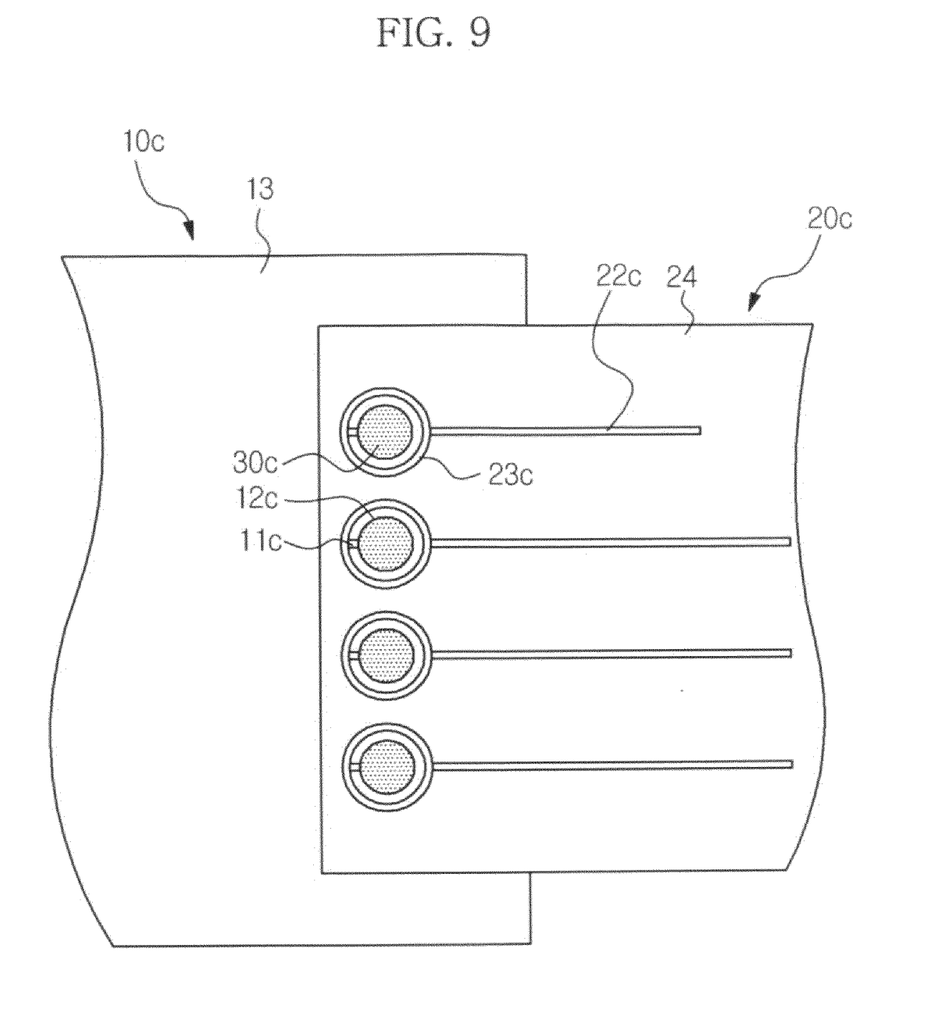
FIG. 9 shows alignment of a first connection terminal and a second connection terminal according to example embodiments.

FIG. 9 shows alignment of a first connection terminal and a second connection terminal according to example embodiments.

As shown in FIG. 9, a first connection terminal 11c may be integrated into a first circuit board 10c while a second connection terminal 22c may be integrated into a second circuit board 20c. Each of the first connection terminal 11c and the second connection terminal 22c may comprise a plurality of connection terminals. FIG. 9 illustrates a plurality of first connecting parts 12c of the plural first connection terminals 11c and a plurality of second connecting parts 23c of the plural second connection terminals 22c aligned in respective rows. If a small number of first connection terminals 11c and second connection terminals 22c are used, that is, if a pitch spacing between adjacent first connecting parts 12c of the first connection terminals 11c or between adjacent second connecting parts 23c of the second connection terminals 22c is relatively large, decreasing possibility of connection by fused solder during fabrication of a circuit board, it may be possible to align a plurality of first connecting parts 12c of first connection terminals 11c and a plurality of second connecting parts 23c of second connection terminals 22c in respective rows. In addition, a plurality of solder bumps 30c may also be aligned in a row to correspond to a plurality of first connecting parts 12c of first connection terminals 11c.

Although example embodiments have been shown and described, it would be appreciated by those skilled in the art that changes may be made in example embodiments without departing from the principles and spirit of the invention, the scope of which is defined in the claims and their equivalents.

What is claimed is:

1. A connection structure for a circuit board, comprising:
a first circuit board having at least one first connection terminal;
a second circuit board having at least one second connection terminal; and
at least one solder bump on the at least one first connection terminal, wherein the at least one second connection terminal includes a connecting part in a perforated part configured to receive at least a part of the at least one solder bump such that the at least one solder bump mechanically attaches the first circuit board to the second circuit board.

2. The connection structure according to claim 1, wherein the connecting part encloses an inner side of the perforated part.

3. The connection structure according to claim 1, wherein the connecting part encloses a periphery of the perforated part.

4. The connection structure according to claim 1, wherein the at least one solder bump includes a part smaller than the perforated part.

5. The connection structure according to claim 1, wherein the perforated part is in a round shape and the connecting part is in a ring shape.

6. The connection structure according to claim 1, wherein the at least one first connection terminal is a plurality of first connection terminals and the at least one second connection terminal is a plurality of second connection terminals and the plurality of first connection terminals and the plurality of second connection terminals are arranged in zig-zag patterns.

7. The connection structure according to claim 6, further comprising:
a first solder mask preventing the plurality of first connection terminals from being interconnected.

8. The connection structure according to claim 6, further comprising:
a second solder mask preventing the plurality of second connection terminals from being interconnected.

9. The connection structure according to claim 1, wherein the at least one first connection terminal is a plurality of first connection terminals and the at least one second connection terminal is a plurality of second connection terminals and the plurality of first connection terminals and the plurality of second connection terminals are arranged in rows.

10. The connection structure according to claim 1, wherein the connecting part is attached to the at least one solder bump.

11. A connection structure of a circuit board, comprising:
a first circuit board having at least one first connection terminal;
a second circuit board having at least one second connection terminal corresponding to the first connection terminal; and
at least one conductive element protruding from the at least one first connection terminal and electrically connecting the at least one first connection terminal to the at least one second connection terminal, wherein the second circuit board has a perforated part coupled with the at least one conductive element which mechanically attaches the first circuit board to the second circuit board.

12. The connection structure according to claim 11, wherein the at least one second connection terminal includes a connecting part in the perforated part and the connecting part is connected to the at least one conductive element.

13. The connection structure according to claim 11, wherein the perforated part and the connecting part receive at least a part of the at least one conductive element.

* * * * *